United States Patent [19]
Laighton

[11] 3,838,443
[45] Sept. 24, 1974

[54] MICROWAVE POWER TRANSISTOR CHIP CARRIER

[75] Inventor: David G. Laighton, Linthicum Heights, Md.

[73] Assignee: Westinghouse Electric Corporation, Pittsburgh, Pa.

[22] Filed: Mar. 15, 1973

[21] Appl. No.: 341,638

Related U.S. Application Data

[63] Continuation of Ser. No. 192,851, Oct. 27, 1971, abandoned.

[52] U.S. Cl. .................... 357/84, 357/81, 333/84 M
[51] Int. Cl. .................... H01l 3/00, H01l 5/00
[58] Field of Search .................... 317/234, 1, 4, 4.1; 333/84 M; 174/52 S

[56] References Cited

UNITED STATES PATENTS

| | | | |
|---|---|---|---|
| 3,489,956 | 1/1970 | Yana et al. | 317/234 |
| 3,509,434 | 4/1970 | Yana et al. | 317/234 |
| 3,626,259 | 12/1971 | Garboushian | 317/235 N |
| 3,651,434 | 3/1972 | McGeough et al. | 317/234 G |
| 3,683,241 | 8/1972 | Duncan | 317/234 |
| 3,710,202 | 1/1973 | Leidich et al. | 317/234 R |
| 3,711,778 | 1/1973 | Day | 317/234 G |

*Primary Examiner*—Andrew J. James
*Attorney, Agent, or Firm*—D. Schron

[57] ABSTRACT

A low-cost mounting assembly for a microwave power transistor chip used in hybrid circuits, which minimizes package parasitics while allowing adequate heat transfer from the transistor chip to a heat sink formed from insulating material. The assembly can be formed entirely by silk screen techniques which materially reduces its cost.

4 Claims, 9 Drawing Figures

MICROWAVE POWER TRANSISTOR CHIP CARRIER

This is a continuation, of application Ser. No. 192,851 filed Oct. 27, 1971, and now abandoned.

BACKGROUND OF THE INVENTION

As is known, a hybrid integrated circuit, like a conventional multi-element circuit, is constructed of individual transistors, diodes, resistors and the like. Conventional transistor and diode dice are used, mounted together with resistors and capacitors on a common header and interconnected by wire bonding to achieve interconnections with very light gauge wire.

A typical microwave power transistor chip has a width of about 0.035 inch, a length of about 0.065 inch and a thickness of only 0.007 inch. It may have as many as five base and emitter bonding pads. The size of the chip, as well as the multiple site pads and fine wire connections, makes it a very difficult unit to handle, test and to assemble into an amplifier. For this reason, most bipolar transistor microwave power amplifiers use packaged power transistors. The microwave power transistor package, however, puts severe limitations on amplifier performance. The equivalent input circuit of a large signal power transistor includes a large parasitic inductive reactance which adds to those of the chip input and its bond wires. The effect of this at microwave frequencies is to increase the input circuit Q factor and thereby severely limit bandwidth. In addition, the relatively low input resistance of the chip presents a problem in matching. Adding package parasitics and lead lengths from the chip to the matching circuit means that the number of mismatches add up vectorially, again to the detriment of bandwidth and efficient matching.

Because of these problems associated with microwave power transistor chips, the manufacturing yields of such devices are very low, yields of 20 percent being considered excellent. This, coupled with the fact that prior art techniques for producing such carriers required the use of expensive vapor deposition techniques and/or machining of blocks of insulating material, has made them very expensive.

SUMMARY OF THE INVENTION

In accordance with the present invention, a transistor chip carrier is provided which is low in cost, reduces parasitic inductances over those experienced with more expensive prior art carriers, and at the same time provides a low thermal impedance to allow adequate heat transfer from the transistor chip itself to a heat sink.

Specifically, there is provided a carrier of the type described comprising a dielectric substrate, preferably beryllia, having deposited on a surface thereof base and collector metalizations, the base metalization being generally U-shaped and the collector metalization comprising a strip disposed between but not touching the legs of the U-shaped base area. Preferably, the base metalization extends over the edges and the bottom of the dielectric substrate for connection to external circuitry.

Deposited over the top of the U-shaped base metalization, while exposing a portion thereof adjacent the collector contact, is an oxide layer, normally having a thickness of about 1 mil; and on top of the oxide coating is an emitter metalization. The transistor chip itself is bonded to the collector contact, while multiple wire bonds connect the emitter and base metalizations to emitter and base regions on the transistor chip. By virtue of the fact that the oxide layer between the base and emitter metalizations is very thin, a capacitor is formed across the base-emitter junction of the transistor. This tends to tune-out lead wire inductance, as well as forming an LC matching network which increases the transformer input impedance.

Further, in accordance with the invention, a method for forming a transistor chip carrier of the type described above is provided wherein the entire device can be fabricated with the use of silk screen techniques alone. That is, by virtue of the thinness of the oxide layer between the base and the emitter metalizations, which forms a capacitor, the oxide may be applied as a suspension in a binder, followed by suitable heating to burn-off the binder in accordance with known techniques. This is in contrast to prior art fabrication methods wherein much thicker oxide coatings are required, necessitating relatively expensive vapor deposition processing and/or machining of oxide wafers.

The above and other objects and features of the invention will become apparent from the following detailed description taken in connection with the accompanying drawings which form a part of this specification, and in which.

DESCRIPTION OF PREFERRED EMBODIMENT

Figure 1:
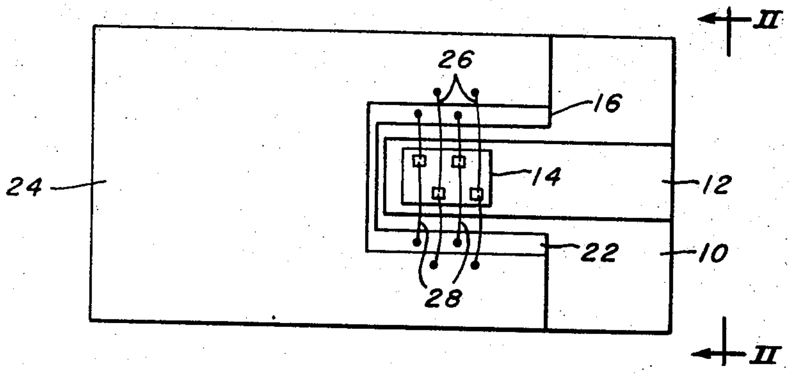
FIG. 1 is a top view of one embodiment of the invention.
Figure 2:
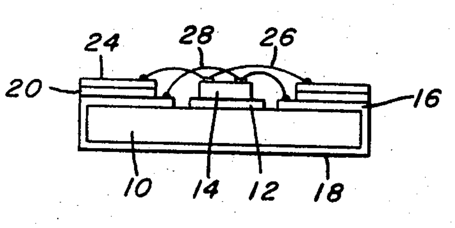
FIG. 2 is an end view of the embodiment of the invention of FIG. 1, taken substantially along line II—II of FIG. 1.

With reference now to the drawings, and particularly to FIGS. 1 and 2, the embodiment of the invention shown includes a dielectric substrate 10 preferably formed from beryllia or some other suitable material which, in addition to serving as a substrate, provides a heat sink for a power transistor chip. The thickness of the substrate 10 may typically be about 25 mils; while its length is about 0.2 inch and its width 0.1 inch.

Deposited on the upper surface of the substrate 10, preferably by the silk screen process hereinafter described, is a collector contact 12. The transistor chip 14 itself comprises a substrate of semiconductive material, including a collector region which is bonded to the metalization 12. Diffused into the collector region is a plurality of base and emitter regions which, as will be explained hereinafter, operate in parallel. The reason for the plurality of base and emitter regions diffused into the single collector region is that the current through the transistor tends to crowd toward the edges of the emitter-base area of a microwave power transistor. Hence, it is desirable to increase the total edge length; and this can be increased by providing a plurality of base and emitter regions rather than a single base and emitter region.

Surrounding the collector metalization 12 is a generally U-shaped base metalization 16, the metalization 12 being between the legs of the U-shaped metalization 16 without touching it. The metalization 16 is continued around the edges of the substrate 10 as viewed in FIG. 2 and continues onto the bottom of the substrate as at 18 for connection to external circuitry.

Deposited on top of the base metalization 16 is an oxide coating 20, preferably aluminum oxide, having a thickness of about 1 mil. The oxide coating 20, however, does not cover a generally U-shaped area 22 around the transistor chip 14 in order to facilitate connection of base leads to the chip in a manner hereinafter described. Finally, an emitter metalization 24 is deposited over the oxide layer 20. Multiple wire leads or bonds 26 are connected in parallel between the emitter contact 24 and emitter regions on the chip 14. Similarly, multiple leads 28 are connected in parallel between the base metalization 16 and the base contact on the chip 14.

The process for manufacturing the carrier of FIGS. 1 and 2 is shown in FIGS. 3A–3D. The first step in the process, shown in FIG. 3A, involves metalization by silk screen techniques to produce both the collector metalization 12 and the base metalization 16. A silk screen, with the base and collector contact areas exposed, is placed over the wafer 10 of beryllia. The paint used is preferably a suspension of gold in a binder which will volatilize and burn-off after firing at about 800°C. Hence, after silk screening, the beryllia wafer 10 with the painted metalizations thereon is subjected to firing at 800°C. After firing, the metalizations 16 and 12 have a thickness of about 0.5 mil. As was explained above, the base metalization 16 extends around and to the bottom of wafer 10, the bottom portion being indicated by the reference numeral 18 in FIG. 2. This metalization may be applied by silk screening or by simply painting and is preferably done after the base and collector metalizations 16 and 12 have been applied but before firing.

Figure 3A:
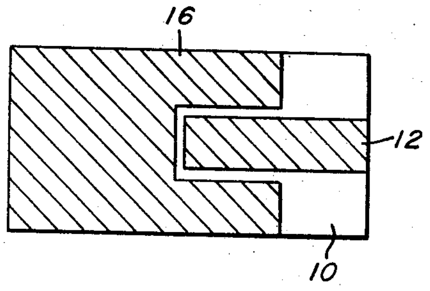
FIGS. 3A–3D show the steps involved in the fabrication of the device of FIG. 1.
Figure 3B:
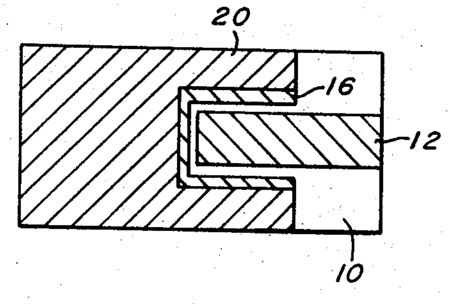
Figure 3C:
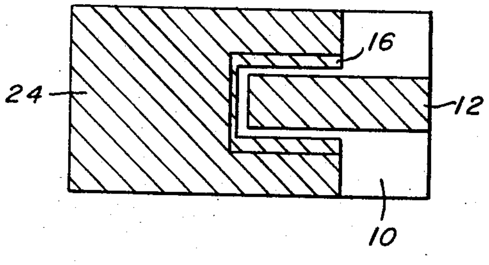
Figure 3D:
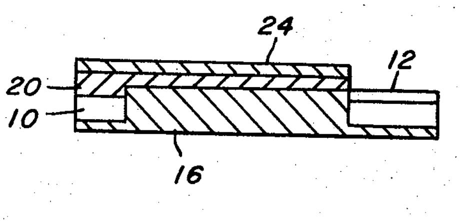

Following formation of the base and collector metalizations, the base metalization 16 is covered with the layer 20 of dielectric material, preferably aluminum oxide. The aluminum oxide layer is applied in the same manner as the metalization, that is, by silk screening. Again, aluminum oxide in suspension within a binder is applied by silk screening and the wafer 10 with the metalizations 16 and 12 and the oxide layer 20 thereon again fired to burn-off the binder, leaving oxide 20 having a thickness of about 1 mil. As will be explained hereinafter, this thickness of the oxide layer facilitates the creation of a capacitor across the base-emitter junction of the transistor which tunes-out lead wire inductance and increases the transistor input impedance. Finally, as shown in FIGS. 3C and 3D, the package is completed by applying the emitter metalization 24 over the oxide layer 20 by silk screen techniques, followed by a subsequent firing operation at about 800°C. The collector region of the transistor chip 14 is then bonded to the collector metalization 12 and the wire bonds 26 and 28 brazed to the contacts 24 and 16 and the chip 14 as shown in FIG. 1.

Figure 4A:
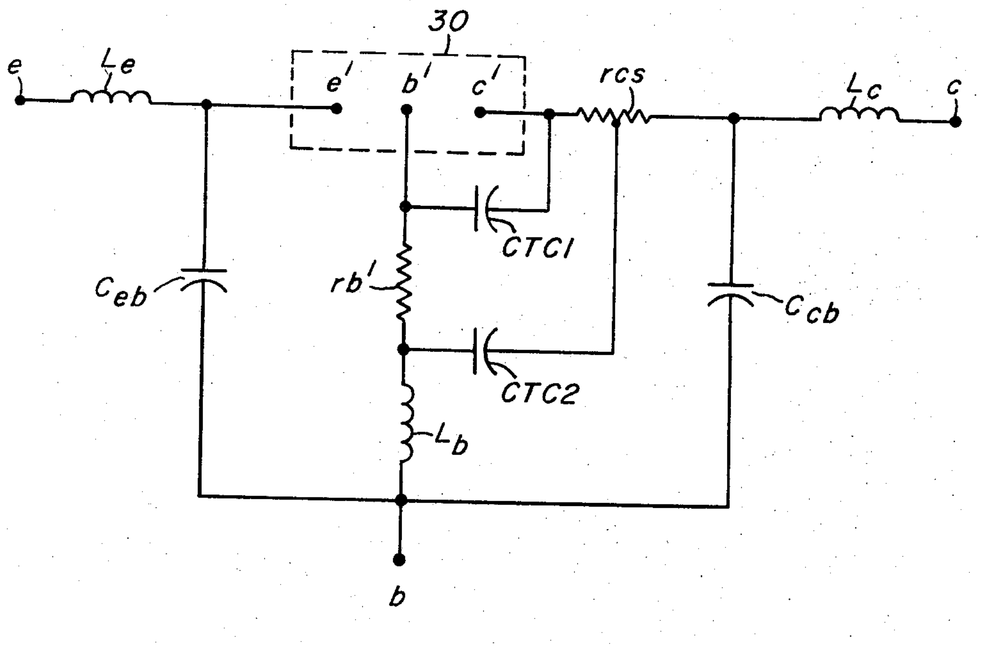
FIGS. 4A–4C are equivalent circuit diagrams showing the effect of providing a thin oxide layer between the base and emitter metalizations, resulting in the imposition of a capacitance between the emitter-base junction of the transistor and an improvement in its lead wire inductance and input impedance.
Figure 4B:
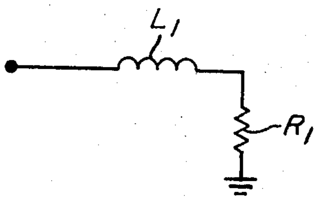

The equivalent circuit diagram for the transistor package is shown in FIG. 4A, the transistor chip itself being indicated by the reference numeral 30 and having emitter, base and collector contacts *e'*, *b'* and *c'*, respectively. Between the emitter, base and collector contacts for the package (identified as *e*, *b* and *c*) are lead-in inductances $L_e$, $L_b$ and $L_c$, respectively. Similarly, across the base-emitter junction is a capacitance $C_{eb}$ and across the base-collector junction is a capacitance $C_{cb}$. The resistance *rb'* is the base spreading resistance, the resistance rcs the collector body resistance and the capacitors CTC1 and CTC2 are the collector capacitances.

Figure 4C:
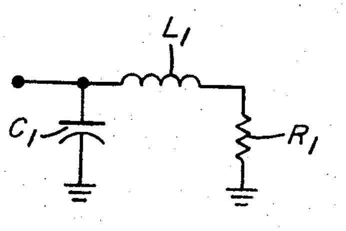

FIG. 4A is an equivalent circuit for a planar diffused transistor plus the inductance of its lead wires. Normal transistor packaging would add additional parasitic inductances and capacitances. Numeral 30 refers to an intrinsic transistor, while $C_{eb}$, rb', CTC1, CTC2, rcs and $C_{cb}$ all refer to effects caused by the physical realization of this intrinsic transistor. Inductances $L_e$, $L_b$ and $L_c$ are effects which are encountered in bonding to any practical mount, either standard package or chip carrier. The capacitor $C_1$ of FIG. 4C is used together with a reduced $L_1$ to achieve lower Q and therefore broader bandwidth capability.

The capacitance $C_1$ is provided in accordance with the present invention by providing the thin oxide layer 20 between the base and emitter contact metalizations 16 and 24 such that the two metalizations act as the opposite plates of the capacitor $C_1$. Thus, by providing the arrangement shown in the drawings and insuring that the thickness of oxide layer 20 is sufficiently small, a good capacitive effect is produced between the emitter and base metalizations, effectively placing a capacitor across the base-emitter junction of the transistor which tunes-out lead wire inductance as well as forming an LC matching network which transforms the transistor input impedance, typically as low as 1 ohm, up to a more suitable value of about 25–40 ohms.

Although the invention has been shown in connection with a certain specific embodiment, it will be readily apparent to those skilled in the art that various changes in form and arrangement of parts may be made to suit requirements without departing from the spirit and scope of the invention.

I claim as my invention:

1. A power transistor chip carrier assembly comprising a substrate of dielectric material, base and collector metalizations deposited on the same surface of said substrate, said base metalization being generally U-shaped and the collector metalization comprising a strip disposed between but not touching the legs of the U-shaped base area, a layer of dielectric material deposited over said base metalization while leaving portions of the base metalization adjacent the collector metalization exposed, an emitter metalization deposited over said dielectric layer, a transistor chip having at least one transistor with a given Q and a given bandwidth having its collector region bonded to said collector metalization, and wire bonds interconnecting said emitter and base metalizations to emitter and base regions on the transistor chip, said dielectric layer having a thickness small enough such that the base and emitter metalizations form the opposite plates of a capacitor connected between the base-emitter junction of said transistor for reducing said given Q and broadening said given bandwidth response.

2. The assembly of claim 1 wherein said dielectric layer has a thickness of about 1 mil and said metalizations have a thickness of about 0.5 mil.

3. The assembly of claim 1 wherein multiple wire bonds interconnect said emitter metalization to emitter regions on the transistor chip in parallel, and multiple wire bonds interconnect the base metalization to base regions on the transistor chip in parallel.

4. The assembly of claim 3 wherein said wire bonds interconnecting the base metalization to base regions on the transistor chip are electrically connected to said base metalization at said exposed portions thereof adjacent the collector metalization.

* * * * *